(12) United States Patent
Tanouchi

(10) Patent No.: US 9,900,986 B2
(45) Date of Patent: Feb. 20, 2018

(54) MOTOR DRIVING DEVICE WITH PRINTED BOARD INCLUDING INSULATING COMPONENT MOUNTED THEREON

(71) Applicant: FANUC CORPORATION, Yamanashi (JP)

(72) Inventor: Hironao Tanouchi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 201 days.

(21) Appl. No.: 14/548,502

(22) Filed: Nov. 20, 2014

(65) Prior Publication Data

US 2015/0146398 A1    May 28, 2015

(30) Foreign Application Priority Data

Nov. 26, 2013    (JP) .................. 2013-244304

(51) Int. Cl.
| | |
|---|---|
| *H05K 7/10* | (2006.01) |
| *H05K 1/18* | (2006.01) |
| *H05K 1/02* | (2006.01) |
| *H05K 7/00* | (2006.01) |
| *H05K 9/00* | (2006.01) |
| *H05K 3/46* | (2006.01) |

(52) U.S. Cl.
CPC .............. *H05K 1/18* (2013.01); *H05K 1/0256* (2013.01); *H05K 3/4694* (2013.01); *H05K 9/0037* (2013.01); *H05K 2201/09045* (2013.01); *H05K 2201/09972* (2013.01)

(58) Field of Classification Search
CPC ........................... H05K 3/4694; H05K 9/0037
USPC .................................................. 361/770, 777
See application file for complete search history.

(56) References Cited

U.S. PATENT DOCUMENTS

| | | | | |
|---|---|---|---|---|
| 5,830,307 | A * | 11/1998 | Hiruta ................. | B41F 15/0818 |
| | | | | 156/247 |
| 2008/0318413 | A1* | 12/2008 | Fillion ................ | H01L 23/5389 |
| | | | | 438/637 |

FOREIGN PATENT DOCUMENTS

| | | |
|---|---|---|
| JP | 2004-249308 A | 9/1992 |
| JP | H04-249308 A | 9/1992 |
| JP | H10013010 A | 1/1998 |
| JP | H11334294 A | 12/1999 |
| JP | 2001-53473 A | 2/2001 |
| JP | 2002118350 A | 4/2002 |
| JP | 2003069216 A | 3/2003 |
| JP | 2009126900 A | 6/2009 |

(Continued)

OTHER PUBLICATIONS

Untranslated Office Action for Japanese Application No. 2013-244304, dated Feb. 3, 2015, 2 pages.

(Continued)

*Primary Examiner* — Binh Tran
(74) *Attorney, Agent, or Firm* — Fredrikson & Byron, P.A.

(57) ABSTRACT

A motor driving device including a printed board on which an insulating component is mounted. The insulating component integrally includes a plate-shaped insulation part formed by a heat resistant resin having an electrical insulation property, and a plate-shaped adhesive part provided at an end portion of the insulation part and formed by a thermoplastic resin having an electrical insulation property, and the insulating component is adhered to a surface of the printed board by thermal welding by heating and melting the adhesive part.

6 Claims, 3 Drawing Sheets

(56) References Cited

FOREIGN PATENT DOCUMENTS

JP 2012064615 A 3/2012

OTHER PUBLICATIONS

English Machine Translation for Japanese Publication No. 2001-053473 published Feb. 23, 2001, 8 pages.
Partial Translation of Japanese Office Action dated Feb. 3, 2015 for Application No. 2013-244304, 2 pages.
English Translation of Abstract for Japanese Publication No. 04-249308, published Sep. 4, 1992, 1 page.
Untranslated Notification of Reasons for Refusal mailed by JPO, dated Feb. 3, 2015, 2 pages.
English machine translation of Notification of Reasons for Refusal mailed by JPO, dated Feb. 3, 2015, 2 pages.
Untranslated Notification of Reasons for Refusal mailed by JPO, dated Jul. 14, 2015, 3 pages.
English machine translation of Notification of Reasons for Refusal mailed by JPO, dated Jul. 14, 2015, 3 pages.
Untranslated Decision of Refusal mailed by JPO, dated Dec. 8, 2015, 2 pages.
English machine translation of Decision of Refusal mailed by JPO, dated Dec. 8, 2015, 2 pages.
Untranslated Decision to Grant a Patent mailed by JPO, dated May 10, 2016, 3 pages.
English machine translation of Decision to Grant a Patent mailed by JPO, dated May 10, 2016, 3 pages.
English Abstract for Japanese Publication No. 2012-064615 published Mar. 29, 2012, 1 pg.
English Translation for Japanese Publication No. 2002118350, published Apr. 19, 2002, 8 pages.
English Translation for Japanese Publication No. H10013010, published Jan. 16, 1998, 8 pages.
English Translation of Japanese Publication No. 2009126900, published Jun. 11, 2009, 13 pages.
English Translation of Japanese Publication No. 2003069216, published Mar. 7, 2003, 10 pages.
English Translation of Japanese Publication No. H11334294, published Dec. 7, 1999, 24 pages.

\* cited by examiner

MOTOR DRIVING DEVICE WITH PRINTED BOARD INCLUDING INSULATING COMPONENT MOUNTED THEREON

BACKGROUND OF INVENTION

1. Field of the Invention

The present invention relates to a motor driving device including a printed board on which an insulating component is mounted.

2. Description of the Related Art

Conventionally, there is a known as device described in Japanese Laid-open Patent Publication No. 2012-64615 (JP2012-064615A) in which an insulating component is mounted on a printed board in order to secure an insulation distance between a plurality of electronic components on the printed board. In the device described in JP2012-064615A, a slit is provided on a printed board on which a plurality of semiconductor devices are mounted, and a plate-shaped insulating component including a folded end portion is inserted into the slit. After the insertion of the insulating component, the folded portion of the insulating component is returned to an original position in order to attach the insulating component to the printed board.

However, according to the device described in JP2012-064615A, the slit needs to be provided at the mounting position of the insulating component. Therefore, when a mounting position of the insulating component needs to be changed, it is not easy to change the position.

SUMMARY OF THE INVENTION

One aspect of the present invention is a motor driving device including a printed board on which an insulating component is mounted, wherein the insulating component integrally includes a plate-shaped insulation part formed by a heat resistant resin having an electrical insulation property, and a plate-shaped adhesive part provided at an end portion of the insulation part and formed by a thermoplastic resin, and the insulating component is adhered to a surface of the printed board by thermal welding by heating and melting the adhesive part.

BRIEF DESCRIPTION OF THE DRAWINGS

An object, a feature, and an advantage of the present invention will become more apparent by the following description of the embodiment related to the accompanying drawings, in which.

DETAILED DESCRIPTION

Figure 1:
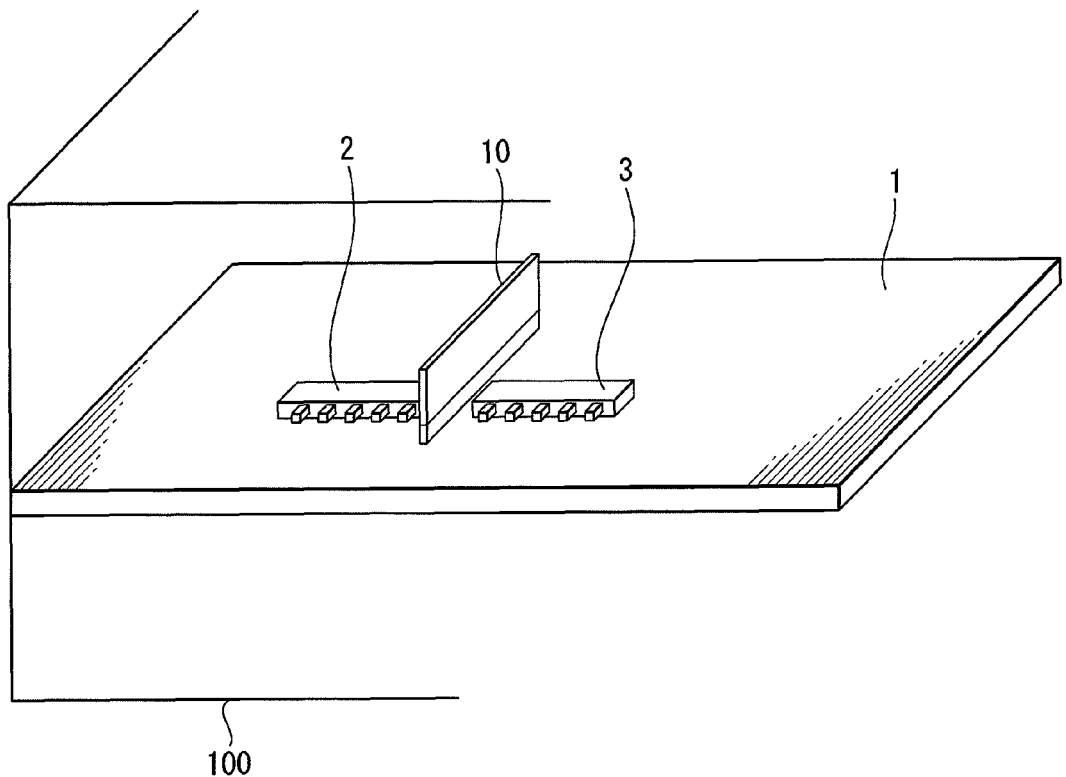
FIG. 1 is a perspective view illustrating a schematic configuration of a printed board provided in a motor driving device according to an embodiment of the present invention.

Hereinafter, a motor driving device according to one embodiment of the present invention is described with reference to FIG. 1 to FIG. 5. The motor driving device such as a servo amplifier or an inverter device includes a printed board on which various electronic components (semiconductor module or the like) are mounted. FIG. 1 is a perspective view illustrating a schematic configuration of the printed board 1 provided in the motor driving device 100 according to the embodiment of the present invention.

As illustrated in FIG. 1, a plurality of conductive electronic components 2 and 3 (two in the drawing) are mounted on the printed board 1. An insulating component 10 is mounted between the electronic components 2 and 3 to secure an insulation distance between the electronic components 2 and 3.

Regarding mounting of the insulating component 10, in a method of simply inserting a plastic plate or the like as an insulating component between the electronic components 2 and 3 close to each other, there is a possibility that the plastic plate may be detached by vibration, etc. Moreover, in a method of adhering the insulating component to the printed board 1 by using an adhesive agent composed of silicone rubber, etc., it is not only difficult to precisely attach the insulating component to a desired position, but also necessary to separately apply the adhesive agent. In addition, in a method of fixing the insulating component to the printed board 1 by using a metal screw, it is difficult to secure an insulation distance. Furthermore, in a method of providing a slit on the printed board 1 and inserting the insulating component into the slit, a mounting position of the insulating component is limited to a position of the slit, and a mounting position of the insulating component cannot be easily changed. In order to deal with these problems, the insulating component 10 is configured as follows in the present embodiment.

Figure 2:
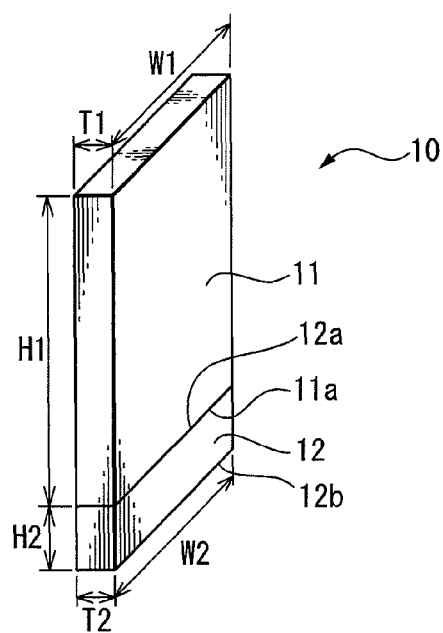
FIG. 2 is a perspective view illustrating an insulating component according to the embodiment of the present invention.

FIG. 2 is a perspective view of the insulating component 10 according to the embodiment of the present invention. FIG. 2 illustrates the insulating component 10 before mounting on the printed board 1. The insulating component 10 includes a plate-shaped insulation part 11 formed by a heat resistance resin with an electrical insulation property and a heat radiation property, and a plate-shaped adhesive part 12 formed by a thermoplastic resin with an electrical insulation property. A melting point of the insulation part 11 is higher than a melting point of the adhesive part 12. The melting point of the adhesive part 12 is higher than a temperature of ambient air surrounding the adhesive part 12 in the motor driving device 100. The adhesive part 12 is melted and is then solidified so that the adhesive part 12 can be adhered to, i.e., welded to the printed board 1.

Each of the insulation part 11 and the adhesive part 12 is formed by a plate-shaped member having fixed thickness, and are formed in a rectangular shape in side view. A height (length) H1 of the insulation part 11 is larger than a height (length) H2 of the adhesive part 12. Meanwhile, a width W1 and a thickness T1 of the insulation part 11 are equal to a width W2 and a thickness T2 of the adhesive part 12, respectively. One end face (lower end face) 11a of the insulation part 11 in the height direction contacts with one end face (upper end face) 12a of the adhesive part 12 in the height direction without a step in the width direction and the thickness direction. The insulation part 11 and the adhesive part 12 are formed by two-color molding, for example, so as to be integrated with each other.

When the insulating component 10 is mounted on the printed board 1, first, the insulating component 10 is held at a predetermined position, for example, a center position between the electronic components 2 and 3 in FIG. 1, in a state in which the other end face (lower end face) 12b of the adhesive part 12 in the height direction is made to contact with an upper face of the printed board 1. Next, the adhesive part 12 is heated until the adhesive part 12 is melted. Then, the adhesive part 12 is naturally or forcibly cooled to solidify the adhesive part 12. Thereby, the insulating component 10 is welded to the printed board 1, and an insulation distance between the electronic components 2 and 3 can be secured by the insulating component 10.

Thus, according to the present embodiment, the insulating component 10 is configured so as to integrally include the plate-shaped insulation part 11 formed by the heat resistance resin with the electrical insulation property, and the plate-shaped adhesive part 12 provided at the end portion of the insulation part 11 and formed by the thermoplastic resin with the electrical insulation property. By thermal welding made by heating and melting the adhesive part 12, the insulating member 10 is adhered to a surface of the printed board 1.

Thereby, the insulating component 10 can be firmly fixed on the printed board 1, and an insulation distance between the electronic components 2 and 3 can be stably secured. Further, compared with a case of using an adhesive agent, the insulating component 10 can be easily and precisely mounted. Furthermore, a slit for insertion of an insulating component does not need to be provided on the printed board 1, and a mounting position of the insulating component 10 can be easily changed. The insulating component 10 can be easily detached from the printed board 1 by performing heat treatment on the adhesive part 12. Accordingly, it is possible to easily deal with a case of replacement, maintenance, or the like of the electronic components 2 and 3.

Figure 3:
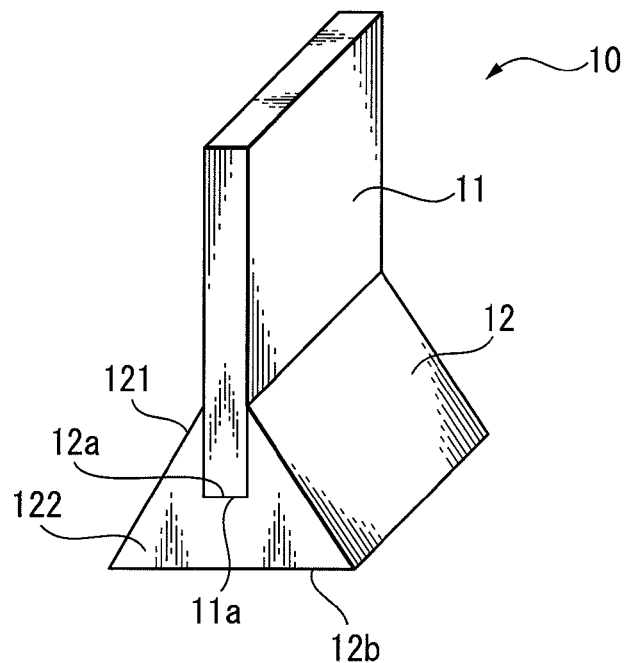
FIG. 3 illustrates a modified example of FIG. 2.
Figure 4:
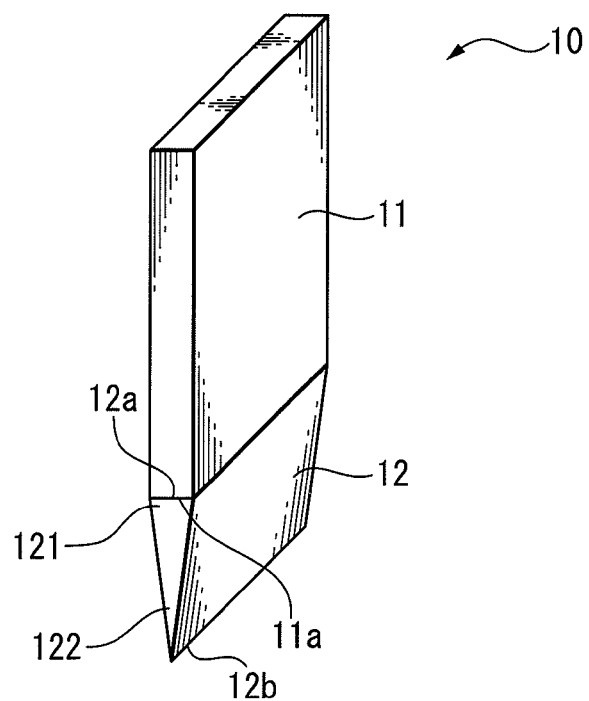
FIG. 4 illustrates another modified example of FIG. 2.

In the above-described embodiment, the adhesive part 12 of the insulating component 10 is formed so as to have a constant thickness in the height direction. However, a thickness of the insulating component 10 may be changed in the height direction. One such example is illustrated in FIG. 3 and FIG. 4. FIG. 3 and FIG. 4 also illustrate states before the adhesive part 12 is melted. In FIG. 3 and FIG. 4, a width of the insulation part 11 and a width of the adhesive part 12 are equal to each other.

As illustrated in FIG. 3, the adhesive part 12 includes a first end portion (upper end portion) 121 which contacts with the insulation part 11, and a second end portion (lower end portion) 122 which is positioned on the opposite side of the first end portion 121 in the height direction and which contacts with the surface of the printed board 1 when the insulating component 10 is mounted. A sectional area of the adhesive part 12, i.e., the sectional area of the adhesive part 12 in a direction (horizontal direction) perpendicular to the height direction gradually increases from the first end portion 121 to the second end portion 122. In other words, the thickness of the upper end face 12a of the adhesive part 12 which contacts with the lower end face 11a of the insulation part 11 is smaller than a thickness of the lower end face 12b of the adhesive part 12 on the opposite side of the upper end face 12a. The thickness of the adhesive part 12 gradually increases from the upper end face 12a to the lower end face 12b.

Thereby, the insulating component 10 can be arranged on the printed board 1 in a stable posture, and work of mounting the insulating component 10 is facilitated. In FIG. 3, the first end portion 121 is started from a position above the lower end face 11a of the insulation part 11. However, the first end portion 121 may be started from the lower end face 11a.

In FIG. 4, differently from FIG. 3, a sectional area of the adhesive part 12 gradually decreases from the first end portion 121 to the second end portion 122. In other words, a thickness of the upper end face 12a of the adhesive part 12 contacting with the lower end face 11a of the insulation part 11 is larger than a thickness of the lower end face 12b of the adhesive part 12 on the opposite side of the upper end face 12a. A thickness of the adhesive part 12 gradually decreases from the upper end face 12a to the lower end face 12b.

Therefore, it is possible to easily arrange the insulating component 10 at a narrow location on the printed board 1. In FIG. 4, a tip end portion of the adhesive part 12 is formed to have an acute angle, and a thickness of the lower end face 12b is zero. However, a thickness of the lower end face 12b may be larger than zero. In other words, the adhesive part 12 may have a trapezoid shape instead of a triangle shape in front view.

Figure 5:
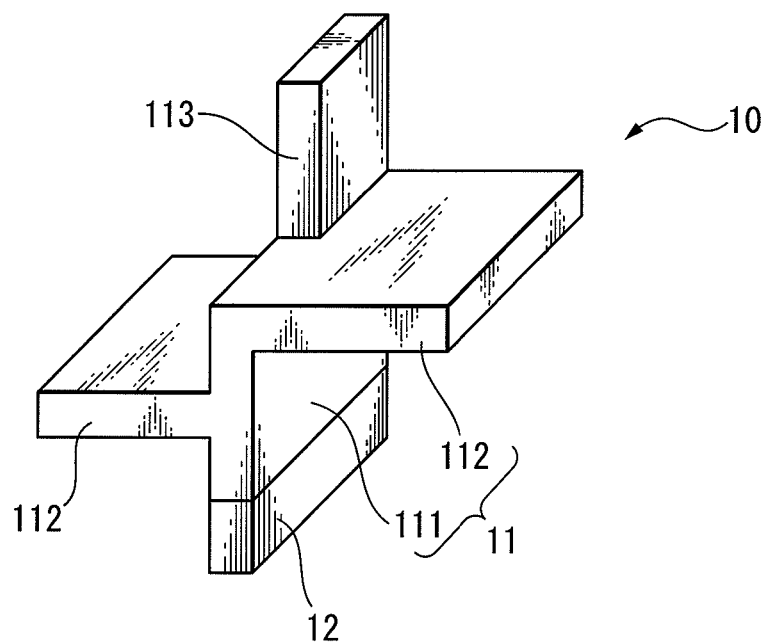
FIG. 5 illustrates further another modified example of FIG. 2.

In the above-described embodiment (FIG. 2), the insulation part 11 and the adhesive part 12 each have a rectangular shape in side view. Shapes of the insulation part 11 and the adhesive part 12 are not limited to this shape. For example, as illustrated in FIG. 5, the insulation part 11 may be formed so as to include a first wall portion 111 extending in the height direction, and a second wall portion 112 extending from the first wall portion 111 at a predetermined angle (for example, 90 degrees) relative to the height direction. The predetermined angle may be larger or smaller than 90 degrees. The second wall portion 112 may be folded from the first wall portion 111 in a circular arc shape.

Further, as illustrated in FIG. 5, a cutout portion 113 for changing a width of the first wall portion 111 may be provided in the first wall portion 111. A cutout portion for changing a width of the second wall portion 112 can be also provided in the second wall portion 112. In other words, a cutout portion having any one of various types of shapes may be provided at the first wall portion 111 or the second wall portion 112 so as to change a width of the first wall portion 111 or the second wall portion 112 in a direction parallel to the surface of the printed board 1.

Adjusting a shape of the insulation part 11 can provide, to the insulating component 10, not only a function of securing an insulation distance between the electronic components 2 and 3, but also an additional function. For example, the insulation part 11 can prevent cutting liquid and mechanical liquid from entering, prevent vibration of the insulating component 10 by reinforcing the insulating component 10, or adjust an air flow rate or an air flow direction in the motor driving device. When the insulation part 11 is formed by a heat resistance resin with an excellent heat radiation property, a temperature in the motor driving device can be adjusted by the insulation part 11.

The above-described embodiment can be arbitrarily combined with one or a plurality of the modified examples.

According to the present invention, the insulating component is configured so as to integrally include the insulation part formed by the heat resistance resin and the adhesive part formed by the thermoplastic resin. By thermal welding by heating and melting the adhesive part, the insulating component is adhered to the surface of the printed board. For this reason, a mounting position of the insulating component can be easily changed.

In the above, the present invention is described in relation to the preferred embodiment. However, a person skilled in the art would understand that various modifications and changes can be made without departing from the range as disclosed in the claims described below.

The invention claimed is:
1. A motor driving device including:
a printed board on which electronic components and an insulating component is mounted,
wherein the insulating component consists of a plate-shaped insulation part formed by a heat resistance resin with an electrical insulation property, and a plate-shaped adhesive part provided at an end portion of the insulation part and being adhered to the printed board, the insulation part and the adhesive part are formed integrally, and the adhesive part has an electrical insulation property and consists of a thermoplastic resin being welded by heat, wherein the insulating component is mounted between a first electronic component and a second electronic component so as to realize insulation between the first electronic component and the second electronic component, wherein the insulating component is configured to be detachable from the printed board and to be remountable on the printed board by performing heat treatment on the adhesive part.

2. The motor driving device according to claim 1, wherein, before the adhesive part is melted, the adhesive part includes a first end portion contacting with the insulation part, and a second end portion contacting the surface of the printed board when the insulating component is mounted, and a sectional area of the adhesive part gradually increases from the first end portion to the second end portion.

3. The motor driving device according to claim 1, wherein, before the adhesive part is melted, the adhesive part includes a first end portion contacting with the insulation part, and a second end portion contacting with the surface of the printed board when the insulating component is mounted, and a sectional area of the adhesive part gradually decreases from the first end portion to the second end portion.

4. The motor driving device according to claim 1, wherein the insulation part includes a first wall portion extending in a height direction, and a second wall portion extending from the first wall portion at a predetermined angle relative to the height direction.

5. The motor driving device according to claim 4, wherein the first wall portion or the second wall portion includes a cutout portion for changing a width of the first wall portion or the second wall portion in a direction parallel to the surface of the printed board.

6. The motor driving device according to claim 1, wherein the adhesive part has an adhesive part melting point and the insulating part has an insulating part melting point, the adhesive part melting point being lower than the insulating part melting point.

* * * * *